United States Patent
Thomas et al.

(10) Patent No.: US 6,803,249 B2
(45) Date of Patent: Oct. 12, 2004

(54) METHOD OF MAKING AN INTEGRATED PHOTODETECTOR IN WHICH A SILICON NITRIDE LAYER FORMS AN ANTI-REFLECTIVE FILM AND PART OF MULTI-LAYER INSULATOR WITHIN TRANSISTOR STRUCTURES

(75) Inventors: Danielle A. Thomas, Dallas, TX (US); Gilles E. Thomas, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/357,958

(22) Filed: Feb. 4, 2003

(65) Prior Publication Data

US 2003/0143786 A1 Jul. 31, 2003

Related U.S. Application Data

(60) Division of application No. 09/838,909, filed on Apr. 20, 2001, now Pat. No. 6,559,488, which is a continuation-in-part of application No. 09/677,268, filed on Oct. 2, 2000, now abandoned.

(51) Int. Cl.$^7$ .............................................. H01L 21/00
(52) U.S. Cl. .......................... 438/59; 438/72; 438/328; 257/E31.115; 257/E31.121
(58) Field of Search .............................. 438/59, 72, 316, 438/325, 328, 335–336, 340–341, FOR 136, FOR 137; 257/E31.115, E31.121

(56) References Cited

U.S. PATENT DOCUMENTS

| | | |
|---|---|---|
| 4,148,048 A | 4/1979 | Takemoto et al. |
| 4,606,115 A | 8/1986 | Kervin et al. |
| 4,670,765 A | 6/1987 | Nakamura et al. |
| 5,049,733 A | 9/1991 | Yoshifusa et al. |
| 5,105,090 A | 4/1992 | Miyajima et al. |
| 5,177,581 A | 1/1993 | Kubo et al. |
| 5,591,960 A | 1/1997 | Furukawa et al. |
| 5,994,162 A | 11/1999 | Burghartz et al. |
| 6,114,740 A | 9/2000 | Takimoto et al. |
| 6,392,282 B1 | 5/2002 | Sahara et al. |

FOREIGN PATENT DOCUMENTS

EP       0 987 767 A2    3/2000

*Primary Examiner*—George Fourson
*Assistant Examiner*—Thanh Pham
(74) *Attorney, Agent, or Firm*—Lisa K. Jorgenson; Peter J. Thoma

(57) ABSTRACT

A photodetector is integrated on a single semiconductor chip with bipolar transistors including a high speed poly-emitter vertical NPN transistor. The photodetector includes a silicon nitride layer serving as an anti-reflective film. The silicon nitride layer and oxide layers on opposite sides thereof insulate edges of a polysilicon emitter from the underlying transistor regions, minimizing the parasitic capacitance between the NPN transistor's emitter and achieving a high frequency response. The method of manufacture is compatible with existing BiCMOS process technology, the silicon nitride layer of the anti-reflective film being formed over the photodetector as well as regions of the chip that include the vertical NPN transistor and other circuit elements.

6 Claims, 3 Drawing Sheets

METHOD OF MAKING AN INTEGRATED PHOTODETECTOR IN WHICH A SILICON NITRIDE LAYER FORMS AN ANTI-REFLECTIVE FILM AND PART OF MULTI-LAYER INSULATOR WITHIN TRANSISTOR STRUCTURES

CROSS-REFERENCE TO RELATED APPLICATIONS

This application is a Division of U.S. patent application Ser. No. 09/838,909 filed Apr. 20, 2001, now U.S. Pat. No. 6,559,488, which is a Continuation-in-Part of U.S. application Ser. No. 09/677,268 filed Oct. 2, 2000, now abandoned.

BACKGROUND OF THE INVENTION

The present invention generally relates to semiconductor photodetectors, and more particularly to an integrated circuit device that includes a photodetector and a process for its fabrication.

Semiconductor photodetectors are well known in the art. U.S. Pat. Nos. 4,670,765 and 5,177,581 disclose examples. Often such photodetectors are integrated with other circuit elements on the same semiconductor chip. U.S. Pat. Nos. 5,049,733 and 5,105,090 disclose examples. Another example that is compatible with a more advanced fabrication process is disclosed in U.S. Pat. No. 5,994,162. These five patents are incorporated by reference herein as background technology.

Semiconductor manufacturers have developed complex process technologies that permit fabrication of high circuit densities on a single silicon chip. Many such technologies have the flexibility of forming either bipolar transistors or field-effect transistors (FETs), or more typically, both types of transistors on the same chip. When both complementary forms of metal-oxide-semiconductor FETs (both N-channel and P-channel MOSFETs) are formed with bipolar transistors on the same chip, the generic process technology is referred to as BiCMOS. Advanced BiCMOS processes provide IC devices that operate at high frequencies suitable for high performance electronic products. The incorporation of a photodetector onto a single semiconductor chip may involve modification of an existing process technology that is compatible with the end-use application. It would be desirable, therefore, to facilitate such a process modification in a way that does not significantly change the structures and functions of basic circuit elements (transistors and capacitors), while minimizing any increase in the number and complexity of process operations.

SUMMARY OF THE INVENTION

In accordance with a principal object of the invention, a photodetector is integrated with high speed bipolar transistors and other semiconductor elements on a single chip, using advanced BiCMOS process technology. The photodetector comprises a thin, light-transmissive layer disposed above a diode having a PN junction lying generally parallel to the light-transmissive layer. The diode is physically isolated from other circuit elements on the same chip, and is electrically interconnected with the chip circuitry using conductive interconnects. The material that forms the light-transmissive layer extends laterally over regions of the chip that include these other circuit elements, which primarily include different types of bipolar transistors. The fabrication process accommodates inclusion of the photodetector structure with a minimum of photolithographic operations by incorporating the laterally extending portions of the light-transmissive layer into the structures of various transistors on the chip without degrading their characteristics.

The novel features believed characteristic of the invention are set forth in the appended claims. The nature of the invention, however, as well as its essential features and advantages, may be understood more fully upon consideration of an illustrative embodiment, when read in conjunction with the accompanying drawings, wherein:

DESCRIPTION OF THE PREFERRED EMBODIMENTS

Figure 1:
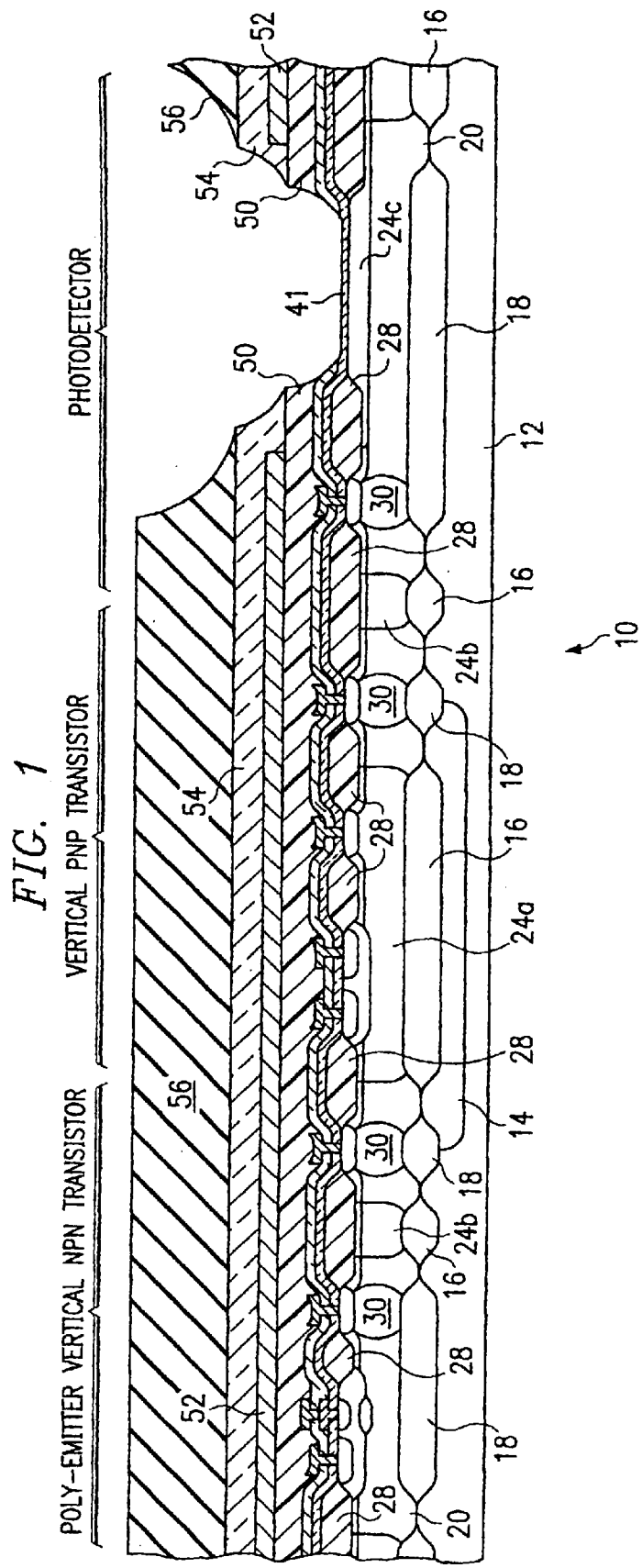
FIG. 1 is a schematic vertical cross-section (not necessarily through a single plane) of a portion of a device embodying the present invention, showing part of a semiconductor chip broken away at its left and right edges from the complete chip.
Figure 2A:
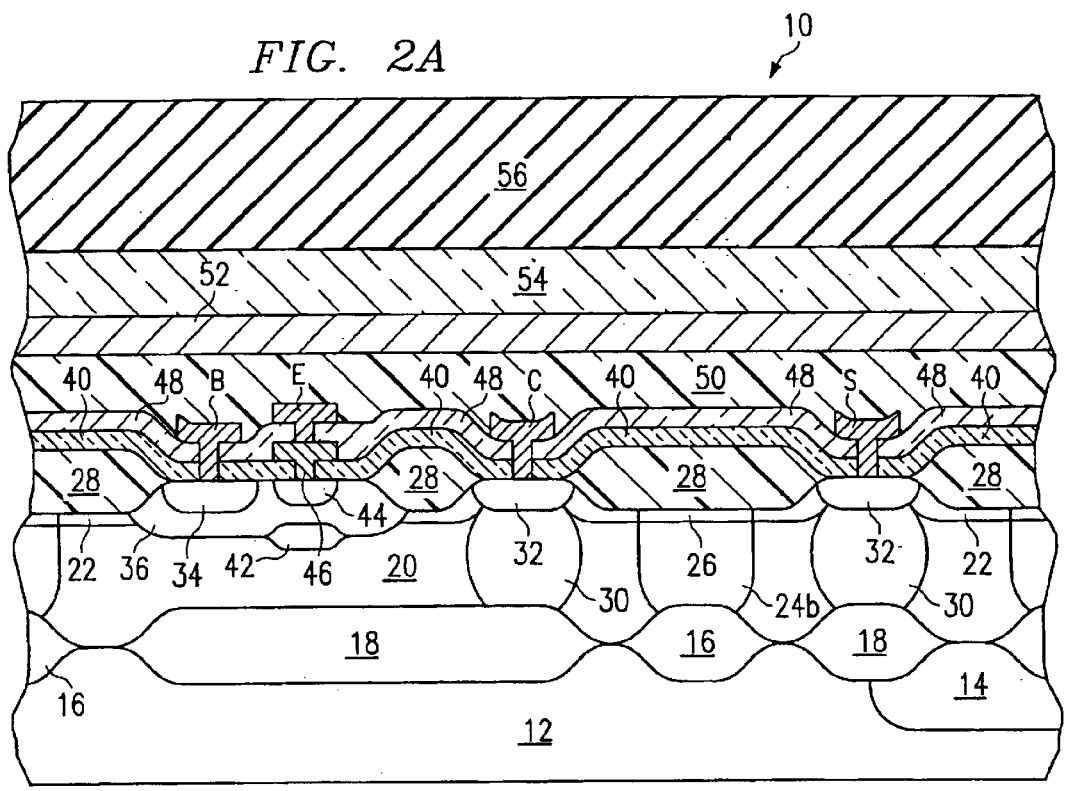
FIG. 2A is an enlarged left-hand portion of FIG. 1 that includes a poly-emitter vertical NPN transistor.
Figure 2B:
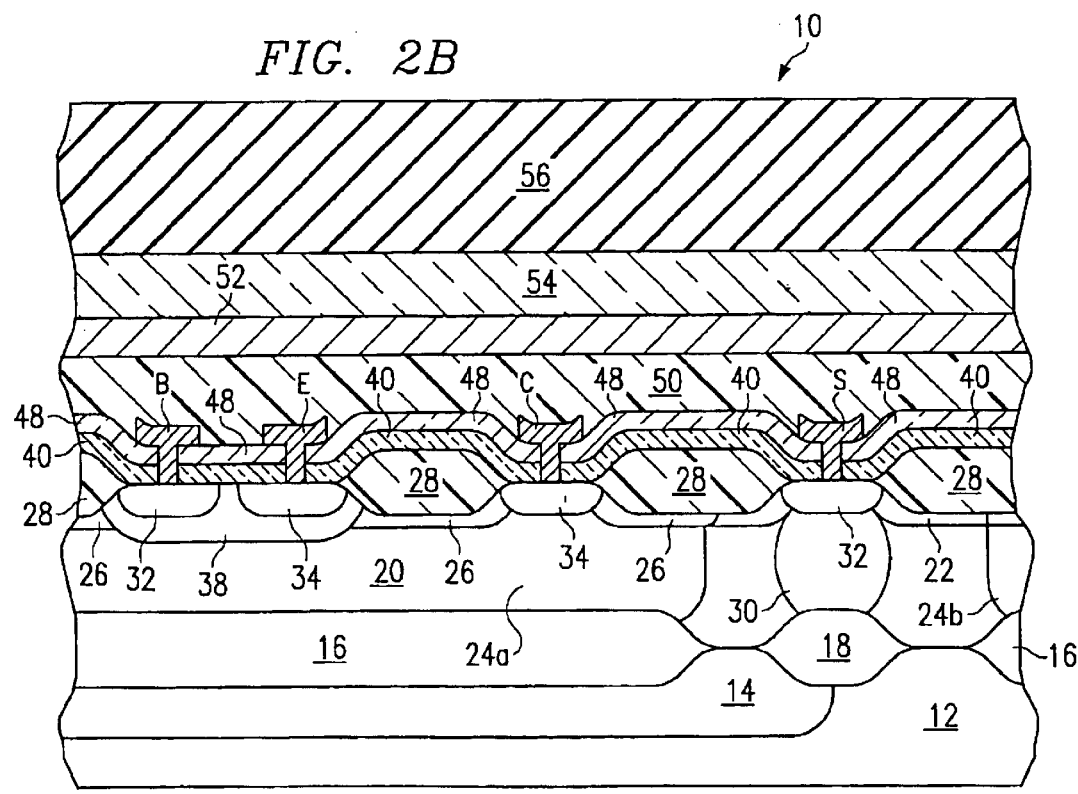
FIG. 2B is an enlarged center portion of FIG. 1 that includes a vertical PNP transistor.
Figure 2C:
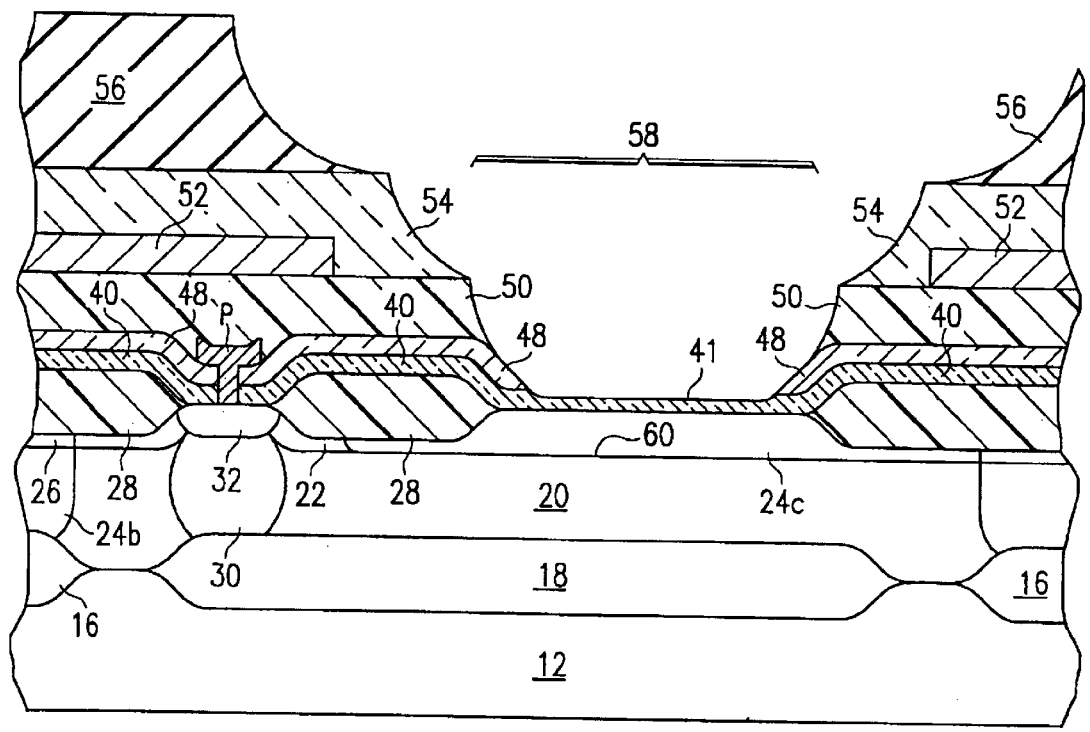
FIG. 2C is an enlarged right-hand portion of FIG. 1 that includes a photodetector.

Referring initially to FIG. 1, FIG. 2A, FIG. 2B and FIG. 2C, a portion of a semiconductor chip is illustrated and designated generally by reference numeral 10. For clarity, some of the numerals used in FIGS. 2A, 2B and 2C are not included in FIG. 1. FIG. 1 shows two of many possible transistors that can be fabricated on the chip 10 together with the photodetector integrated thereon. The portion labeled "poly-emitter vertical NPN transistor" is shown in the enlarged view of FIG. 2A, the portion labeled "vertical PNP transistor" is shown in the enlarged view of FIG. 2B, and the portion labeled "photodetector" is shown in the enlarged view of FIG. 2C.

The chip 10 is fabricated on a substrate 12, which preferably is lightly doped P-type silicon having a resistivity of 10 to 20 ohm-cm. Various buried layers are formed in the substrate 12 using conventional processing techniques, including $N^-$ buried layer 14, $P^+$ buried layers 16, and $N^+$ buried layers 18.

A lightly doped N-type epitaxial layer 20 is formed on the substrate 12 using a conventional epitaxial deposition process. Various conventional ion implantation operations are then performed to selectively dope regions within the epitaxial layer 20. These doped regions include N− field implants 22 (some of which are labeled in FIGS. 2A, 2B and 2C), $P^-$ wells 24a, 24b, and 24c, and P field implants 26.

Oxide isolation regions are then formed, preferably using a patterned nitride layer (not shown) to selectively grow thermal oxide to a thickness of about 6000 Å. This produces a patterned field oxide layer 28. Further ion implantation operations are then performed to produce $N^+$ sinkers 30, $N^+$ contact regions 32, $P^+$ contact regions 34, $P^-$ base implant 36 (FIG. 2A), and $N^-$ base implant 38 (FIG. 2B). Preferably, a clean-up sequence follows that includes formation of a new, extremely thin, thermal oxide layer (not shown) in the active areas, preferably to a thickness of about 65 Å.

Figure 3:
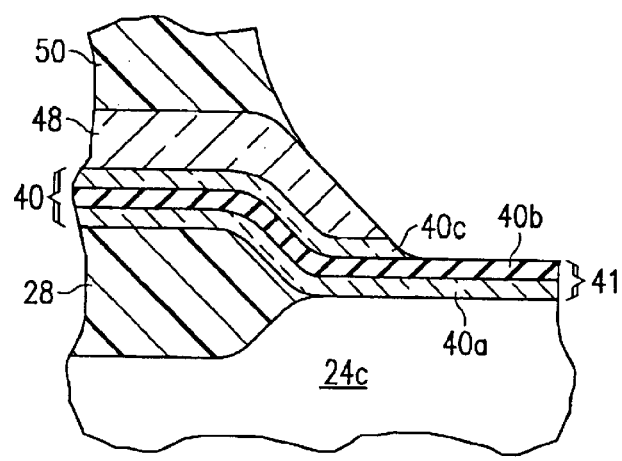
FIG. 3 is a greatly enlarged portion of FIG. 2C showing additional details of a light-transmissive layer that defines part of the disclosed photodetector.

Now referring to FIG. 3, an important feature of the invention will be described. First, an oxide layer 40a is deposited, preferably to a thickness of about 350 Å. This deposition is preferably performed at about 670° C. using TEOS (tetra-ethyl-ortho-silicate) as the source material in accordance with well-known process techniques. Next, a silicon nitride (Si$_3$N$_4$) layer 40b is deposited in a conventional manner to a preferred thickness of about 500 Å. It will be appreciated that this layer will serve as an anti-reflective film in the completed device. Next, an additional TEOS deposition is performed to form oxide layer 40c to a preferred thickness of about 650 Å.

Layers 40a, 40b and 40c are not shown separately in FIGS. 1, 2A, 2B and 2C because they are too thin to illustrate without great distortion. Where all three layers are present, they are referred to herein as a composite insulating layer and are designated collectively by reference numeral 40. In FIG. 3, it is shown that oxide layer 40c terminates just to the right of the edge of the field oxide layer 28, so that only layers 40a and 40b extend out over P⁻ well 24c. Layers 40a and 40b are collectively referred to herein as light-transmissive layer 41, which is an important structural feature of the photodetector element, the operation of which is described below.

Referring again to FIG. 2A, after composite insulating layer 40 has been formed, an opening is dry cut therethrough over base region 36. This is followed by a phosphorus implantation preferably at a dose of $2.0 \times 10^{12}$ atoms/cm$^2$ at an energy of 240 KeV. This forms selectively implanted collector (SIC) region 42. The SIC region contributes to the speed of the poly-emitter vertical NPN transistor, which has a frequency response preferably greater than 9 gigahertz.

Then, after a clean-up operation, a deposition of polycrystalline silicon (more simply referred to as polysilicon) is performed. The polysilicon layer is implanted with arsenic. This ion implantation procedure not only dopes the polysilicon but also dopes a portion of the underlying silicon producing emitter region 44. The polysilicon layer is then selectively etched to leave poly-emitter 46 in place over the emitter region 44. It will be appreciated that the resulting structural features also contribute to high speed transistor response.

A glass deposition follows to form BPSG layer 48 using well-known process steps. Contact openings are then made by selective etching followed by metal deposition and patterning to form base, emitter, collector, and source contacts (labeled B, E, C and S in FIGS. 2A and 2B), and a photodetector contact (labeled P in FIG. 2C).

Referring again to FIG. 1, an interlevel dielectric (ILD) layer 50 is formed using conventional oxide deposition and spin-on-glass (SOG) planarization techniques. This produces a relatively flat surface atop ILD layer 50. A second metal deposition and patterning sequence is performed to form metal screen plate 52. This is followed by a conventional oxide passivation deposition to produce PSG layer 54. Then, an optional polyimide layer 56 is formed atop the device, which can serve to reduce the stress on the chip 10 during the subsequent packaging operation.

Referring again to FIG. 2C, an opening or window 58 is formed down to light-transmissive layer 41 by a sequence of selective etching steps, removing portions of layers 56, 54, 50, 48. Also, as shown specifically in FIG. 3, oxide layer 40c is removed to expose nitride layer 40b, which is the top layer of light-transmissive layer 41. Preferably, the window 58 is rectangular in top view, having length to width ratio of 1.5, which improves the optical sensitivity.

The chip 10 is then packaged in a protective housing by bonding the substrate 12 to an electrode (not shown) and encapsulating the chip 10 in an IC package (not shown), which will include a transparent resin portion (not shown) over the window 58. The chip 10 may include many transistors and other IC elements (capacitors and resistors) of which only two transistors are shown, together with the integrated photodetector. In a modified form of the invention in which the chip 10 includes MOS-gated elements, the composite insulating layer 40 can be used as an interlevel dielectric between first and second level polysilicon layers to form a switch-mode capacitor.

Those skilled in the art will understand without further elaboration how the illustrated structures function. The poly-emitter vertical NPN transistor (FIG. 2A) and the vertical PNP transistor (FIG. 2B) each operate in a well-known manner. For the most basic IC device with an integrated photodetector according to the invention, only bipolar transistors may need to be fabricated with only slight modification to an existing BiCMOS process technology.

The photodetector (FIG. 2C) also operates in a well-known manner. P-type region 24c and the underlying portion of the N-type epitaxial layer 20 form a PN junction or diode 60 that produces current when energized by photons passing through the light-transmissive layer. Light generates electron-hole pairs inside the space-charge region of the PN junction 60. As a result, positive current flows from photodetector contact P through regions 32, 30, 18 and 20 to the PN junction 60. In effect, the metal contact P serves as the current drain for the diode 60.

In accordance with an important feature of the invention, the composite insulating layer 40 forms part of the transistor structures as well as contributing its lower two layers 40a and 40b (FIG. 3) to the photodetector. The overall thickness and dielectric properties of the composite insulating layer 40 are chosen to provide a suitable parasitic capacitance between the edges or shoulder portions of the poly-emitter 46 and the base region 36 of the NPN transistor (FIG. 2A). The thicknesses of layers 40a and 40b of light-transmissive layer 41 (FIGS. 2C and 3) are also selected so that light-transmissive layer 41 is anti-reflective to light wavelengths in the 650 to 750 nanometer range. The use of silicon nitride as an anti-reflective film of a photodetector is known in the art as disclosed, for example, in U.S. Pat. No. 5,177,581. The present invention achieves a substantial improvement in performance over such prior art devices.

Although a preferred embodiment of the invention has been described in detail, it is to be understood that various changes, substitutions and alterations can be made therein without departing from the spirit and scope of the invention as set forth in the appended claims.

What is claimed is:

1. A method of manufacturing an integrated circuit device on a single semiconductor chip, comprising:

providing a substrate of a first conductivity type;

forming an epitaxial layer of a second conductivity type on the substrate; and forming transistors and a photodetector at laterally spaced locations on the chip, the transistors and photodetector being defined by active regions within the epitaxial layer and contacts to respective active regions, the contacts being formed above an upper surface of the epitaxial layer in contact with the active regions;

wherein a silicon nitride layer is formed as an anti-reflective film in the structure of the photodetector, the silicon nitride layer extending laterally from the photodetector to regions of the chip that include the transistors and performing an insulating function within the structures of the transistors, wherein the contacts are formed after formation of the silicon nitride layer and extend through the silicon nitride layer; and wherein the anti-reflective film is formed by depositing a first oxide layer over the device including over the active regions that define the photodetector, then depositing the silicon nitride layer over the first oxide layer, then depositing a second oxide layer over the silicon nitride layer, and subsequently selectively removing portions of the second oxide layer to expose a substantial portion of the silicon nitride layer over the active regions of the photodetector.

2. The method of claim 1 wherein the formation of the transistors includes formation of at least one poly-emitter vertical NPN transistor and at least one vertical PNP transistor.

3. A method of making an integrated photodetector device, comprising:

providing a body of semiconductor material;

forming N-type and P-type regions within the body including active transistor regions and regions defining a PN junction of a photodetector;

depositing a first oxide layer over the body overlying the transistor and photodetector active regions;

depositing a silicon nitride layer atop the first oxide layer;

depositing a second oxide layer atop the silicon nitride layer;

forming contact openings through the second oxide layer, silicon nitride layer and first oxide layer at selective locations above the body;

forming contacts in the openings to contact the various active regions of the transistors and photodetector;

depositing an interlevel dielectric layer;

planarizing the interlevel dielectric layer to provide a planarized top surface;

depositing a metal screen plate atop the interlevel dielectric layer;

depositing a passivation layer over the device; and selectively removing portions of the passivation layer, the metal screen plate, the interlevel dielectric layer, and the second oxide layer to expose the silicon nitride layer over the photodetector.

4. The method of claim 3 wherein the portions of the metal screen plate that are selectively removed over the photodetector are removed prior to depositing the passivation layer.

5. The method of claim 3 further comprising:

depositing a glass layer over the second oxide layer, wherein the step of forming contact openings also forms openings through the glass layer, and wherein the selectively removing step also selectively removes portions of the glass layer over the photodetector.

6. The method of claim 3 further comprising:

defining a P-type base region of a vertical NPN transistor as part of the step of forming N-type and P-type regions within the body;

dry cutting an opening through the second oxide layer, silicon nitride layer and first oxide layer over the base region of the vertical NPN transistor;

forming an N-type collector region within the body beneath the dry cut opening;

selectively depositing polysilicon to form a poly-emitter in the dry cut opening, the polysilicon having shoulder portions overlying the second oxide layer adjacent to the dry cut opening;

doping the polysilicon and an underlying region of the body with an N-type dopant to define an emitter region therein vertically spaced from the N-type collector region, a thin portion of the P-type base region separating the N-type emitter and collector regions;

depositing a glass layer over the device; and forming a contact through the glass layer to the poly-emitter and contacts through the glass layer and underlying oxide and nitride layers as part of the step of forming contacts to the various active regions.

* * * * *